(12) United States Patent
Tamura et al.

(10) Patent No.: US 7,582,905 B2
(45) Date of Patent: Sep. 1, 2009

(54) SEMICONDUCTOR LIGHT EMITTING DEVICE

(75) Inventors: Kentaro Tamura, Kyoto (JP); Ken Nakahara, Kyoto (JP)

(73) Assignee: Rohm Co., Ltd., Kyoto-shi (JP)

( * ) Notice: Subject to any disclaimer, the term of this patent is extended or adjusted under 35 U.S.C. 154(b) by 289 days.

(21) Appl. No.: 11/662,097

(22) PCT Filed: Sep. 7, 2005

(86) PCT No.: PCT/JP2005/016398

§ 371 (c)(1),
(2), (4) Date: Mar. 7, 2007

(87) PCT Pub. No.: WO2006/028118

PCT Pub. Date: Mar. 16, 2006

(65) Prior Publication Data

US 2008/0073659 A1    Mar. 27, 2008

(30) Foreign Application Priority Data

Sep. 8, 2004    (JP)    .............................. 2004-260524

(51) Int. Cl.
*H01L 27/15*    (2006.01)
(52) U.S. Cl. .......................................... 257/79; 257/99
(58) Field of Classification Search .................. 257/79, 257/99, 745
See application file for complete search history.

(56) References Cited

U.S. PATENT DOCUMENTS 5,563,422 A    10/1996    Nakamura et al.

2003/0107053 A1    6/2003    Uemura et al.
2008/0073659 A1*   3/2008    Tamura et al. ................ 257/97

FOREIGN PATENT DOCUMENTS

| JP | 2001-339101 | 12/2001 |
| JP | 2002-151740 | 5/2002 |
| JP | 2002-164570 | 6/2002 |
| JP | 2003-006907 | 1/2003 |
| JP | 2004-165654 | 6/2004 |
| JP | 2004-244560 | 9/2004 |

OTHER PUBLICATIONS

Ken Nakahara et al., "Improved External Efficiency InGaN-based Light-Emitting Diodes with Transparent Conductive Ga-Doped ZnO as p-Electrodes", Japanese Journal of Applied Physics vol. 43, No. 2A, 2004, pp. L180-L182.

* cited by examiner

*Primary Examiner*—Mark Prenty
(74) *Attorney, Agent, or Firm*—Rabin & Berdo, PC

(57)    ABSTRACT

A semiconductor light emitting device is provided, in which the light emitting efficiency of a LED is improved. A semiconductor light emitting device (11) includes a light emitting layer (16) made of a GaN-based semiconductor sandwiched with an n-type GaN-based semiconductor layer (17) and a p-type GaN-based semiconductor layer (15), and a ZnO-based or an ITO transparent electrode layer (14). Further, a value of an equation represented by $3t/(A/\pi)^{1/2} - 3(t/(A/\pi)^{1/2})^2 + (t/(A/\pi)^{1/2})^3$ is 0.1 or more, where a thickness of the transparent electrode layer is represented by t and an area of the light emitting layer (light emitting area) of the light emitting device (11) is represented by A. The light emitting efficiency is improved using the transparent electrode layer (14) having an optimum thickness to the light emitting area.

20 Claims, 6 Drawing Sheets

(a)

(b)

(a)

(b)

(a)

(b)

(c)

SEMICONDUCTOR LIGHT EMITTING DEVICE

FIELD OF THE INVENTION

The present invention relates to a GaN-based semiconductor light emitting device formed with GaN-based semiconductor layers. Especially, it relates to a GaN-based semiconductor light emitting device superior in light emitting efficiency and light emitting output.

BACKGROUND OF THE INVENTION

The GaN-based semiconductor light emitting device comprising the GaN-based semiconductor layer is considered to be a next generation lighting source replacing the fluorescent lamp. The GaN-based semiconductor light emitting device basically includes a pn junction diode in which a light-emitting layer is sandwiched between an n-type GaN-based semiconductor layer and a p-type GaN-based semiconductor layer. Electrons are injected into the light emitting layer from the n-type GaN-based semiconductor layer, holes are injected into the light emitting layer from the p-type GaN-based semiconductor layer, and they are recombined and emit light in the light emitting layer.

Conventionally, in a red, orange, or yellow LED, there is technology in which light is taken out with high efficiency from the light emitting layer of the LED by depositing a thick semiconductor current diffusion layer consisting of any one kind of GaP, GaAsP, and AlGaAs, which are materials that are transparent to the wavelength of each LED (which means to transmit light emitted in the LED and having its wavelength, below the same). On the other hand, in a LED made of a GaN-based material (GaN-based LED) that emits green, blue, purple, or ultraviolet light, there is a problem that the above-described materials are opaque to a light emission wavelength (a wavelength of the light emitted in the light emitting layer, below the same) and are not appropriate as a transparent current diffusion layer.

For the GaN-based LED that emits green, blue, purple, or ultraviolet light, the n-type GaN-based semiconductor layer or the p-type GaN-based semiconductor layer may be transparent, and the n-type GaN-based semiconductor layer also may function as the current diffusion layer. However, the p-type GaN-based semiconductor layer is not preferable because the thickness is normally 0.3 μm or less due to its high resistance and element resistance increases by thickening further. Therefore, it is not appropriate to use as the current diffusion layer flowing current effectively in the entire device.

Then, in the GaN-based LED, a transparent electrode layer is formed to cover substantially the entire surface on the top of the p-type GaN-based semiconductor layer. Generally, a metal electrode such as Ni and Au alloy is used for the transparent electrode, by forming an extremely thin layer as 0.1 μm or less. Thereby it is made to be transparent, although it is translucent, and possible to transmit the light from the light emitting layer. However, light extraction efficiency is poor.

Consequently, technology is known to improve the light extraction efficiency by using a transparent and conductive material such as ITO (indium tin oxide) or ZnO-based compound (that means oxides including Zn, for example, ZnO, oxides of a group II element, and/or oxides of a group IIB element) (for example, refer to Patent Document 1). Further, in Non-Patent Document 1, the inventors of the present invention actually showed technology in which the light emitting efficiency of the GaN-based semiconductor light emitting device is improved by using a ZnO transparent electrode layer doped with Ga. However, to use practically the LED for a lighting lamp or the like, the higher the light emitting efficiency of the GaN-based LED to be used as a white light source, the more preferable it is. However, under the present conditions, it is inferior to the light emitting efficiency of a luminescent lamp, and technology that further increases the light emitting efficiency of the GaN-based LED for practical use is necessary.

In the technology using the above-described transparent electrode layer, because thickness of the transparent electrode layer is a few μm or less, a part of the light generated in the GaN-based semiconductor light emitting layer that transmits in a vertical direction to the light emitting layer from each light emitting point is radiated from a surface to the outside. However, it becomes difficult to radiate to the outside of the element (which means semiconductor layers and electrodes of one chip, below the same), in case of lights which transmits to the direction tilted from the vertical direction, though they are most of the light emitted in the light emitting layer, they may be captured in the inside of the element by repeating total reflections in the element, and there is a problem that it is not radiated to the outside of the element.

Patent Document 1: Japanese Patent Application Laid-Open (JP-A) No. 2002-164570
Non-Patent Document 1: Japanese Journal of Applied Physics Vol. 43, No. 2A, 2004, pp. L180-L182.

DISCLOSURE OF THE INVENTION

Problem to be Solved by the Invention

An objective of the present invention is to improve light emitting efficiency and light emitting output of a GaN-based semiconductor light emitting device by setting the thickness of a transparent electrode layer or the thickness of an insulating layer formed to be in contact with a part of the top face or a part of the side faces of the transparent electrode layer to an optimum thickness in the GaN-based semiconductor light emitting device equipped with a transparent electrode in order to solve the problem that the above-described conventional technology has.

Means for Solving the Problems

In order to achieve the objective described above, the present inventors found the following fact and completed the present invention as a result of going through devoted investigations. In GaN-based semiconductor light emitting devices equipped with a ZnO transparent electrode layer in which the ZnO transparent electrode layer has a different thickness of 0.2 μm, 0.45 μm, 0.9 μm, 5 μm, 20 μm, 50 μm, or 162 μm, with increase in thickness of the transparent electrode layer, the external quantum efficiency increases from 23.0% to 50.4% (refer to FIG. 9(b) showing the external quantum efficiency). This means that the light extraction efficiency (efficiency of light radiated from the surface of the element) is improved due to the increase of the film thickness, and it is determined that the correlation of the thickness of the transparent electrode layer and the light extraction efficiency is represented with the following equation. That is, in the event that a thickness of the transparent electrode layer is represented by t and a light emitting area (an area of light emitting layer) is represented by A, when a film thickness t is set so that R represented with $R=3t/(A/\pi)^{1/2}-3(t/(A/\pi)^{1/2})^2+(t/(A/\pi)^{1/2})^3$ is equal to 0.1, the light emitting output increases 10% or more compared to when the thickness of the transparent electrode layer is thin. Moreover, R in this equation represents the rate of increase of the light emitting output. When $t/(A/\pi)^{1/2}$ represented with the thickness t of the transparent electrode layer and the light emitting area A is small, that is, when the thickness t of the transparent electrode layer is thin and sufficiently small compared to $(A/\pi)^{1/2}$ represented with the light emitting area A, the rate of increase R of the light emitting output to the increase in thickness t of the transparent electrode layer increases almost linearly to the increase in thickness t of the transparent electrode layer. Then, when the thickness t of the transparent electrode layer becomes about half of $(A/\pi)^{1/2}$, the rate of increase R becomes slow to change with thickness t. Furthermore, when the thickness t increases and becomes to near the same value as $(A/\pi)^{1/2}$, the rate R of increase hardly changes. The above-described equation shows these relations of these changes. Therefore, when the light emitting area A of the element (light emitting layer) is large, setting the thickness t of the transparent electrode layer thick exhibits remarkable effect for the increase of the light emitting output.

Explaining specifically, FIGS. 11 (a) to (c) show an example of the top surface view of each light emitting device. In each Figure, an area occupied by the transparent electrode layer corresponds to the light emitting area A. In the case of FIG. 11 (a), the area occupied by the transparent electrode layer becomes 320 μm×320 μm=102,400 μm². For example, when the light emitting area A of the element is A=102,400 μm² and t is set to t=6.5 μm, R becomes R=0.104 and the light emitting output increases at a ratio of R=0.104 that is about 10% compared to when the thickness of the transparent electrode layer is as thin as 1 μm or less. Here, when R becomes R≧0.9, the increase in light emitting output to the increase of the thickness of the transparent electrode layer becomes slow compared to the case of R≦0.9, and as a result productivity becomes poor. Consequently, the range of 0.1≦R≦0.9 is preferable for practical use (refer to FIG. 9 (a) showing the rate of increase of the light emitting output). Furthermore, when the thickness t of the transparent electrode layer becomes t=10 μm, R becomes R=0.157, and when t becomes t=20 μm, R becomes R=0.297. Then, when the thickness t of the transparent electrode layer becomes t=30 μm, R becomes R=0.420 and the rate of increase of the light emitting output becomes slow, and as a result the condition of which R≦0.3 is preferable. When the thickness of the transparent electrode is 7 μm≦t≦13 μm, R becomes 0.112≦R≦0.200 and it becomes a preferable condition.

Not limited to the transparent electrode layer, also by increasing the thickness of the transparent insulating layer to be in contact with a part of the surface or a part of the side face of the transparent electrode layer, the light emitting efficiency is improved in the same manner. Conventionally, the thickness of the transparent insulating layer is about a few hundred nm. However, when t in the above-described equation is treated as $t_i$ and the film thickness $t=t_i$ of the insulating layer so that R becomes R≧0.1, the light emitting efficiency of the GaN-based semiconductor light emitting device increases in the same manner as the transparent electrode layer described before. Also in this case, in the same manner as the thickness of the transparent electrode layer, when the thickness of the insulating layer becomes $t_i$≧1 μm, the light emitting output increases a few % or more compared to when $t_i$<1 μm. Furthermore, $t_i$≧5 μm is preferable and $t_i$≧10 μm is more preferable. Examples of the transparent insulating layer that can be used include $SiO_u$ (u≧0), $SiO_uN_v$ (u≧0, v≧0), $Al_2O_3$, AlN, $Mg_xZn_{1-x}O$ (0≦x≦1), and $ZrO_2$, and the refractive index of the insulating layer is preferably smaller compared to the refractive index of the transparent electrode layer because when light emitted in the light emitting layer is incident to the insulating layer from the transparent electrode layer, a reflecting light can be suppressed with thanks to a small incident angle.

Conventionally, a translucent electrode layer made of a metal such as Ni/Au is used by setting the thickness of the electrode layer to 0.1 μm or less to obtain transparency in the GaN-based semiconductor light emitting device. However, also in the case of using such a transparent electrode layer that is difficult to be made thick, by forming an insulating layer to be in contact with a part of the surface or a part of the side face of the transparent electrode layer and setting the thickness $t=t_i$ of the insulating layer so that R in the above-described equation becomes R>0.1, it becomes possible to increase the light emitting efficiency and the light emitting output of the GaN-based semiconductor light emitting device. Further, in such a case, it is preferable to form the insulating layer also in contact with the side faces of the GaN-based semiconductor layers and the electrode (element) and to have a larger refractive index of the insulating layer compared to the refractive index of the transparent electrode layer or the GaN-based semiconductor layer because the total reflection angle does not exist at a boundary face with the insulating layer. For example, in the case of a Ni/Au translucent electrode, when the film thickness is thick, the light transmitting the electrode layer is absorbed correspondingly, and the efficiency becomes poor. However, when the film thickness of the electrode layer is made thin, the light absorbed becomes small, and by conducting the light as much as possible to the thick insulating layer, light extraction efficiency (efficiency taking out light) increases.

A semiconductor light emitting device according to the present first invention includes: a light emitting layer made of a GaN-based semiconductor sandwiched between an n-type GaN-based semiconductor layer and a p-type GaN-based semiconductor layer; and a transparent electrode layer which is provided on one side of the light emitting layer and transparent to a wavelength of a light emitted in the light emitting layer, wherein a value of an equation represented by $3t/(A/\pi)^{1/2}-3(t/(A/\pi)^{1/2})^2+(t/(A/\pi)^{1/2})^3$ is 0.1 or more, where a thickness of the transparent electrode layer is represented by t and an area of the light emitting layer is represented by A.

That is, in the case of a thin transparent electrode layer in which the conventional thickness is a few hundred nm or less, the light from the GaN-based semiconductor light emitting layer is taken out only from the top face of the transparent electrode layer and the light is hardly taken out from the side faces of the transparent electrode. However, with the first invention in the present application, a part of the light emitted in the light emitting layer can be taken out also from the side faces of the element via the side faces of the transparent electrode layer, the light emitting efficiency increases, and with this, the light emitting output of the light emitting device can be increased.

In the present application, the GaN-based semiconductor light emitting layer refers to a semiconductor layer including at least one layer of $Al_pGa_{1-p-q}In_qN$ (0≦p+q≦1, p≧0, q≧0).

A semiconductor light emitting device of the second invention in the present application includes: a light emitting layer made of a GaN-based semiconductor sandwiched between an n-type GaN-based semiconductor layer and a p-type GaN-based semiconductor layer; a transparent electrode layer which is provided on one side of the light emitting layer and transparent to a wavelength of a light emitted in the light emitting layer; and a transparent insulating layer formed to be in contact with a part of a surface or a part of side faces of the transparent electrode layer, wherein a value of an equation represented by $3t_i/(A/\pi)^{1/2}-3(t_i/(A/\pi)^{1/2})^2+(t_i/(A/\pi)^{1/2})^3$ is 0.1 or more, where a thickness of the transparent insulating layer is $t_i$ and an area of the light emitting layer is A.

With the second invention in the present application, a part of the light emitted from the light emitting layer can be taken out also from the side faces of the element via the side faces of the insulating layer, the light emitting efficiency increases and with this, the light emitting output of the light emitting device can be increased.

The third invention in the present application is the semiconductor light emitting device in the first invention in the present application, in which further includes an insulating layer formed to be in contact with a part of a surface or a part of side faces of the transparent electrode layer.

Although the light emitted from the light emitting layer has a part of the light passing and being taken out to the outside the transparent electrode and a part of the light reflecting to the inside of the element at the surface or the side faces of the element, with the third invention in the present application, since the insulating layer is formed, it becomes possible to decrease the ratio of the part of the light reflecting to the inside of the element, with this, the part of the light passing and being taken out increases, and the GaN-based semiconductor light emitting device superior in light emitting efficiency can be obtained.

The fourth invention in the present application which is the semiconductor light emitting device in the first invention in the present application, further includes a transparent insulating layer formed to be in contact with a part of a surface or a part of side faces of the transparent electrode layer, wherein the value of the equation represented by $3t_i/(A/\pi)^{1/2} - 3(t_i/(A/\pi)^{1/2})^2 + (t_i/(A/\pi)^{1/2})^3$ is 0.1 or more, where a thickness of the transparent insulating layer is $t_i$ and an area of the light emitting layer is A.

With the fourth invention in the present application, a part of the light emitted from the light emitting layer can be taken out also from the side faces of the element via the side faces of the transparent electrode layer or the side faces of the transparent insulating layer, thereby the light emitting efficiency increases, and with this, the light emitting output of the light emitting device can be increased.

The fifth invention in the present application is the semiconductor light emitting device in the first or second invention in the present application, in which further includes a metal electrode to supply an electric current to the n-type GaN-based semiconductor layer or the p-type GaN-based semiconductor layer, wherein the above-described transparent electrode layer is formed between the above-described n-type GaN-based semiconductor layer or the above-described p-type GaN-based semiconductor layer and the metal electrode.

With the fifth invention in the present application, it becomes easy to supply an electric current to the transparent electrode layer, and the GaN-based semiconductor light emitting device superior in light emitting efficiency can be obtained.

The sixth invention in the present application is the semiconductor light emitting device in the first or second invention in the present application, in which further includes a metal electrode to supply an electric current to the above-described n-type GaN-based semiconductor layer or the above-described p-type GaN-based semiconductor layer, wherein the metal electrode and the above-described transparent electrode layer are adjacent, and wherein the metal electrode and the above-described transparent electrode layer are formed to be in contact with the face of the above-described n-type GaN-based semiconductor layer or the face of the above-described p-type GaN-based semiconductor layer.

With the sixth invention in the present application, it becomes easy to supply an electric current to the transparent electrode layer, and by selecting a metal material so that an electric contact of the metal electrode and the n-type GaN-based semiconductor layer or the p-type GaN-based semiconductor layer becomes a Schottky contact, light emission with a good power efficiency is obtained, and the GaN-based semiconductor light emitting device superior in light emitting efficiency can be obtained.

The seventh invention in the present application is the semiconductor light emitting device in the first or second invention in the present application, in which the transparent electrode layer comprises a compound including at least one kind selected from the group consisting of magnesium (Mg), aluminum (Al), nickel (Ni), copper (Cu), zinc (Zn), gallium (Ga), indium (In), ruthenium (Ru), and tin (Sn), and including oxygen (O). Examples of these compounds include $MgIn_2O_4$, $CuAlO_2$, NiO, $Cu_2O$, $SrCu_2O_2$, LaCuOS, ZnO, $Ga_2O_3$, $In_2O_3$, ITO, $RuO_2$, and $SnO_2$.

With the seventh invention in the present application, the GaN-based semiconductor light emitting device having a transparent electrode layer superior in conductivity and transparency can be obtained, and that is superior in light emitting efficiency.

The eighth invention in the present application is the semiconductor light emitting device in the seventh invention in the present application, in which the transparent electrode layer comprises $Mg_xZn_{1-x}O$ ($0 \leq x \leq 1$) doped with gallium (Ga) or boron (B).

With the eighth invention in the present application, the GaN-based semiconductor light emitting device can be obtained, which has a transparent electrode layer superior in conductivity and transparency, furthermore superior in electric contact characteristic to the n-type GaN-based semiconductor layer or the p-type GaN-based semiconductor layer, and has a good ohmic characteristic especially to the p-type GaN-based semiconductor layer, and thereby it is superior in light emitting efficiency.

The ninth invention in the present application is the semiconductor light emitting device in the seventh invention in the present application, in which the transparent electrode layer comprises $Mg_xZn_{1-x}O$ ($0 \leq x \leq 1$) doped with aluminum (Al).

With the ninth invention in the present application, the GaN-based semiconductor light emitting device can be obtained, which has a transparent electrode layer superior in conductivity and transparency, furthermore superior in electric contact characteristic to the n-type GaN-based semiconductor layer or the p-type GaN-based semiconductor layer, and which is industrially inexpensive because it is made of inexpensive element materials, and that is superior in light emitting efficiency.

The tenth invention in the present application is the semiconductor light emitting device in the second or third invention in the present application, in which the insulating layer is a compound including at least one kind selected from a first element group consisting of a group II element and at least one kind selected from a second element group consisting of oxygen (O), fluorine (F), and sulfur (S). Examples of the group II element that can be used are magnesium (Mg), calcium (Ca), zinc (Zn), strontium (Sr), and barium (Ba). Examples of these compounds include MgO, MgS, MgZnS, $MgF_2$, $CaF_2$, $CaCO_3$, $CaWO_4$, $CaHfO_3$, $CaAl_2O_4$, ZnO, ZnS, $ZnWO_4$, MgZnO, SrO, SrS, $SrTiO_3$, $BaF_2$, $BaB_2O_4$, and $BaTiO_3$.

With the tenth invention in the present application, the GaN-based semiconductor light emitting device can be obtained, which has the insulating layer superior in insulating property and light transmissivity, and that is superior in light emitting efficiency.

The eleventh invention in the present application is the semiconductor light emitting device in the second or third invention in the present application, in which the insulating layer is a compound including at least one kind selected from a first element group consisting of a group III element and at least one kind selected from a second element group consisting of oxygen (O) and nitrogen (N). Examples of the group III element that can be used are boron (B), aluminum (Al), scandium (Sc), gallium (Ga), yttrium (Y), and Indium (In). Examples of these compounds include BN, AlN, $Al_2O_3$, $LaAlO_2$, $Sc_2O_3$, $ScAlMgO_4$, $Ga_2O_3$, $Y_2O_3$, $YAlO_3$, $In_2O_3$, and $InZnGaO_4$.

With the eleventh invention in the present application, the GaN-based semiconductor light emitting device can be obtained, which has the insulating layer superior in insulating property and light transmissivity and a high hardness, and that is superior in light emitting efficiency.

The twelfth invention in the present application is the semiconductor light emitting device in the second or third invention in the present application, in which the insulating layer is a compound including at least one kind selected from a first element group consisting of a group IV element and at least one kind selected from a second element group consisting of oxygen (O) and nitrogen (N). Examples of the group IV element that can be used are silicon (Si), titanium (Ti), germanium (Ge), zirconium (Zr), tin (Sn), and hafnium (Hf). Examples of these compounds include $SiO_2$, $Si_3N_4$, $TiO_2$, $KTiPO_4$, $GeO_2$, $Bi_4Ge_3O_{12}$, $ZrO_2$, $SnO_2$, and $HfO_2$.

With the twelfth invention in the present application, the GaN-based semiconductor light emitting device can be obtained, which has the insulating layer superior in insulating property and transmissivity and having good processing characteristics, and that is superior in light emitting efficiency.

The thirteenth invention in the present application is the semiconductor light emitting device in the second or third invention in the present application, in which the insulating layer comprises $Mg_xZn_{1-x}O$ ($0 \leq x \leq 1$). The $Mg_xZn_{1-x}O$ ($0 \leq x \leq 1$) is applicable to the transparent electrode layer too, by doping a group III element such as boron, gallium, or aluminum. However, if it is not doped with the group III element such as boron, gallium, or aluminum, it becomes applicable as an insulating layer, and the insulating layer may be doped with a group V element such as nitrogen.

With the thirteenth invention in the present application, the GaN-based semiconductor light emitting device can be obtained, which has the insulating layer superior in insulating property and transmissivity and less stress to the transparent electrode layer especially in the case of using $Mg_xZn_{1-x}O$ ($0 \leq x \leq 1$) doped with a group III element such as boron, gallium, or aluminum, and that is superior in light emitting efficiency.

The fourteenth invention in the present application is the semiconductor light emitting device in the second or third invention in the present application, in which the insulating layer comprises $B_yAl_{1-y-z}Ga_zN$ ($0 \leq y+z \leq 1$, $0 \leq y$, $0 \leq z$).

With the fourteenth invention in the present application, the GaN-based semiconductor light emitting device can be obtained, which has the insulating layer superior in insulating property, transmissivity, and thermal conductivity, and which gives no stress especially to the GaN-based semiconductor light emitting device, and that is superior in light emitting efficiency.

The fifteenth invention in the present application is the semiconductor light emitting device in the second or third invention in the present application, in which the insulating layer comprises $SiO_uN_v$ ($0 \leq u$, $0 \leq v$).

With the fifteenth invention in the present application, the GaN-based semiconductor light emitting device can be obtained, which has the insulating layer superior in insulating property, transmissivity, and processing characteristics, and a desired refractivity can be obtained especially by adjusting the ratio of oxygen and nitrogen, and that is superior in light emitting efficiency.

The sixteenth invention in the present application is the semiconductor light emitting device in the second or third invention in the present application, in which refractivity $n_i$ of the insulating layer is the refractivity n of the transparent electrode layer or less and $n_i \leq n$.

With the sixteenth invention in the present application, because the refractivity of the insulating layer is equal or smaller than the refractivity of the transparent electrode layer, the reflection of the light traveling to the direction of the surface of the electrode layer can be decreased at the interface of the transparent electrode layer and the insulating layer, and therefore, the light is taken out from the insulating layer to the outside of the element through the transparent electrode layer and the insulating layer with good efficiency, and the GaN-based semiconductor light emitting device can be obtained that is superior in the light extraction efficiency not only in the direction of the side faces of the element but also in the direction of the top surface of the element.

The seventeenth invention in the present application is the semiconductor light emitting device in the second or third invention in the present application, in which refractivity $n_i$ of the insulating layer is larger than the refractivity n of the transparent electrode layer, that is $n_i > n$, and the thickness t of the transparent electrode layer is $t \leq 1$ μm.

With the seventeenth invention in the present application, because the refractivity of the insulating layer is larger than the refractivity of the transparent electrode layer, a total reflection angle does not exist at the interface of the transparent electrode layer and the insulating layer, and the GaN-based semiconductor light emitting device can be obtained that is superior in the light extraction efficiency even if the transparent electrode layer is made thin. In other words, also in the case where it is difficult to deposit the transparent electrode layer thickly, for example, using a Ni/Au translucent electrode layer, the GaN-based semiconductor light emitting device can be obtained that is superior in the light extraction efficiency.

Moreover, each of these constitutions can be combined in every possibility.

Effect of the Invention

As described above, according to the present invention, because the GaN-based semiconductor light emitting device can take out light effectively from the top surface and side faces of the transparent electrode layer and the insulating layer by depositing the transparent electrode layer or the insulating layer to an optimum thickness, a semiconductor light emitting device can be obtained that is superior in light emitting efficiency and that has a large light emitting output.

Figure 1:
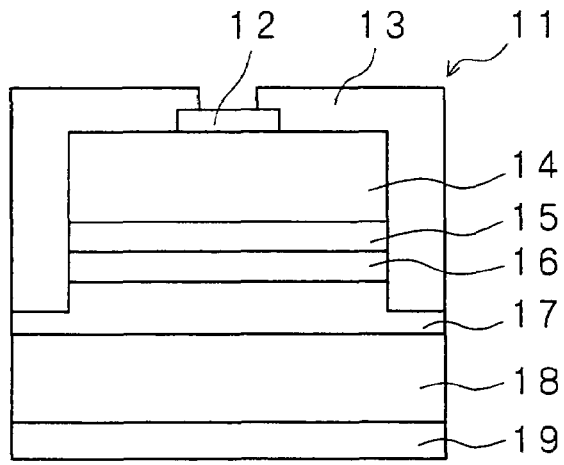
FIG. 1 is a sectional view of the light emitting device of an embodiment in the present invention.

DESCRIPTION OF THE CODE 11, 21, 31, 41, 51, 61, 71, 81 light emitting device (semiconductor light emitting device)
12, 22, 32, 42, 52, 62, 72, 82 metal electrode
13, 23, 33, 43, 53, 63, 73, 83 insulating layer
14, 24, 34, 44, 54, 64, 74, 84 transparent electrode layer
15, 25, 35, 45, 55, 65, 75, 85 p-type GaN-based semiconductor layer
16, 26, 36, 46, 56, 66, 76, 86 GaN-based semiconductor light emitting layer
17, 27, 37, 47, 57, 67, 77, 87 n-type GaN-based semiconductor layer
18, 28, 48, 68, 78 conductive substrate
19, 69, 79 second metal electrode layer (reflection electrode layer)
29 pattern electrode layer
20 second insulating layer
30, 50, 60 reflection electrode layer
39, 89 reflection metal layer
38, 88 non-conductive substrate (insulating substrate)
40, 49, 59, 90 second metal electrode

BEST MODE FOR CARRYING OUT THE INVENTION

Below, the embodiments of the present invention are explained referring to the attached Figures. The first embodiment of the present invention is shown in FIG. 1. As shown in FIG. 1, a light emitting device (semiconductor light emitting device) 11, which is a GaN-based semiconductor light emitting device, includes a metal electrode 12, an insulating layer 13, a transparent electrode layer 14, a p-type GaN-based semiconductor layer 15, a GaN-based semiconductor light emitting layer 16, an n-typed GaN-based semiconductor layer 17, a conductive substrate 18, and a second metal electrode layer 19. The second metal electrode layer 19 of the present embodiment may function as a reflection electrode layer.

Such the GaN-based semiconductor light emitting device is preferably formed using a metal organic chemical vapor deposition method (MOCVD), and other than this, a molecular beam epitaxy method (MBE), an HVPE method, etc. are also preferable. First, using these methods, the n-type GaN-based semiconductor layer 17 is formed on a top surface of the conductive substrate 18. The conductive substrate 18 is preferably silicon carbide (SiC), and other than this, ZnO, GaN, Si, and $ZrB_2$ are also preferable. The n-type GaN-based semiconductor layer 17 includes preferably an n-type GaN buffer layer doped with Si and an n-type $Al_pGa_{1-p}N$ ($0 \leq p \leq 1$) buffer layer doped with Si.

The GaN-based semiconductor light emitting layer 16 is formed on the top surface of the n-type GaN-based semiconductor layer 17. The GaN-based semiconductor light emitting layer 16 is preferably made of an $Al_pGa_{1-p-q}In_qN$ ($0 \leq p+q \leq 1$, $0 \leq p$, $0 \leq q$), and is formed by double heterostructure or multiple quantum well structure of $Al_pGa_{1-p-q}In_qN/Al_rGa_{1-r-s}In_sN$ ($0 \leq p+q \leq 1$, $0 \leq p$, $0 \leq q$, $0 \leq r+s \leq 1$, $0 \leq r$, $0 \leq s$), where the ratio of at least either Al or In is adjusted, and may be doped with Si. A superlattice structure layer made of $Al_pGa_{1-p-q}In_qN/Al_rGa_{1-r-s}In_sN$ ($0 \leq p+q \leq 1$, $0 \leq p$, $0 \leq q$, $0 \leq r+s \leq 1$, $0 \leq r$, $0 \leq s$), where the ratio of at least either Al or In is adjusted may be provided between the GaN-based semiconductor light emitting layer 16 and the n-type GaN-based semiconductor layer 17.

The p-type GaN-based semiconductor layer 15 doped with Mg or Zn is formed on the top surface of the GaN-based semiconductor light emitting layer 16. A layer made of $Al_pGa_{1-p}N$ ($0 \leq p \leq 1$) doped with Mg or Zn may be provided between the GaN-based semiconductor light emitting layer 16 and the p-type GaN-based semiconductor layer 15.

Figure 9:
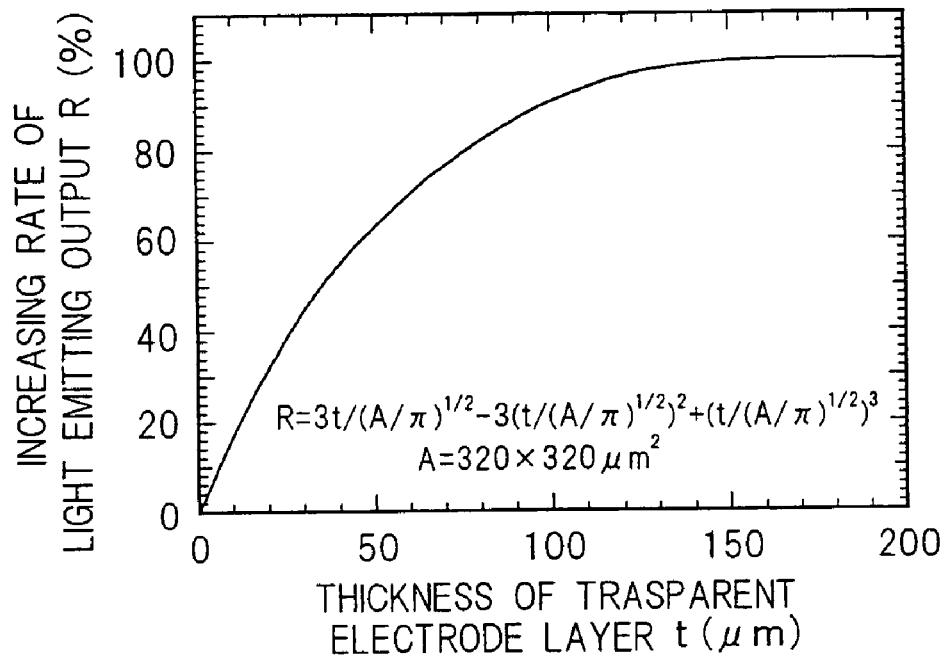
FIGS. 9(a) and (b) are graphs to explain light extraction efficiency in the light emitting device.
Figure 9:
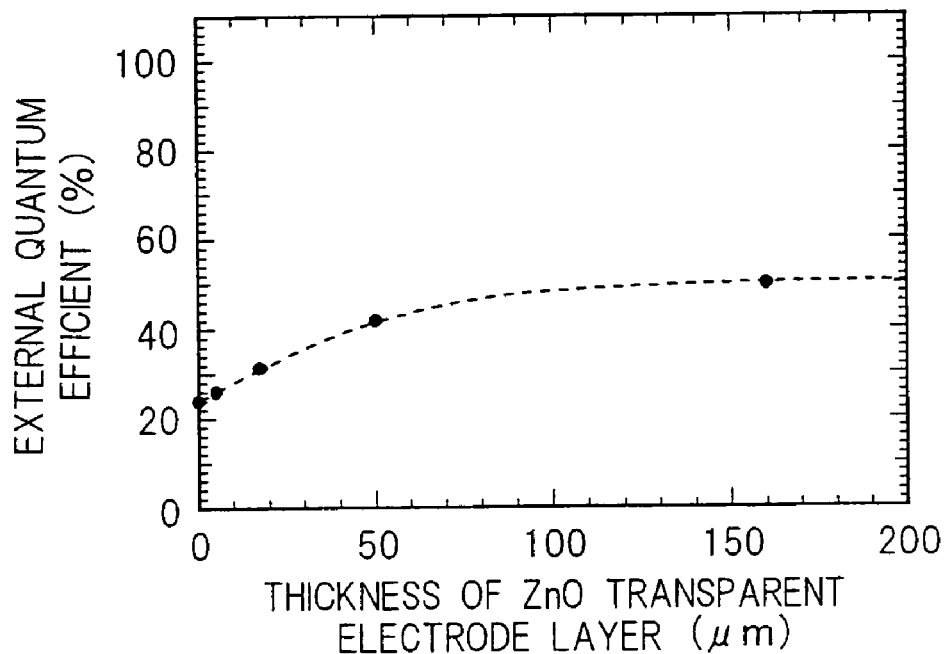

The transparent electrode layer 14 made of $Mg_xZn_{1-x}O$ ($0 \leq x \leq 1$) doped with Ga is formed on the top surface of the p-type GaN-based semiconductor layer 15. The $Mg_xZn_{1-x}O$ ($0 \leq x \leq 1$) transparent electrode layer 14 may be doped with B, Al, or In instead of Ga. The thickness t of the $Mg_xZn_{1-x}O$ ($0 \leq x \leq 1$) transparent electrode layer 14 is preferably t=50 μm with considering the light emitting efficiency and the productivity. In the value R of equation (1) represented by $$R = 3t/(A/\pi)^{1/2} - 3(t/(A/\pi)^{1/2})^2 + (t/(A/\pi)^{1/2})^3 \quad (1)$$

when t=50 μm for an element having light emitting area A=102,400 μm², R becomes R=0.622, that is, the light emitting output increases 62% compared to when the thickness of the transparent electrode layer is 1 μm or less (refer to FIG. 9(a) showing the increasing rate of the light emitting output). By setting the thickness t of the $Mg_xZn_{1-x}O$ ($0 \leq x \leq 1$) transparent electrode layer 14 to a thickness such that R becomes R≥0.1, that is, when A=102,400 μm², t≥6.5 μm, an increase of the light emitting output of 10% or more is expected, and it is preferable. Furthermore, when the thickness t of the transparent electrode layer becomes t=10 μm, R becomes R=0.157, and when t becomes t=20 μm, R becomes R=0.297. And, when R becomes R=0.420, the increasing rate of the light emitting output becomes slow, in which the thickness t of the transparent electrode layer is t=30 μm, then the condition such that R≤0.3 is better. When the thickness t of the transparent electrode layer is 7 μm≤t≤13 μm, R is 0.112≤R≤0.200 and it becomes a more preferable condition. FIG. 9(b) shows the change in the external quantum efficiency of the GaN-based semiconductor light emitting device 11 to the thickness of the ZnO transparent electrode layer 14, and the external quantum efficiency increases according to the thickness of the ZnO transparent electrode layer 14. Therefore, by increasing the thickness of the ZnO transparent electrode layer 14, an increase of the light emitting efficiency and the increase of the light emitting output of the GaN-based semiconductor light emitting device 11 are possible.

Figure 10:
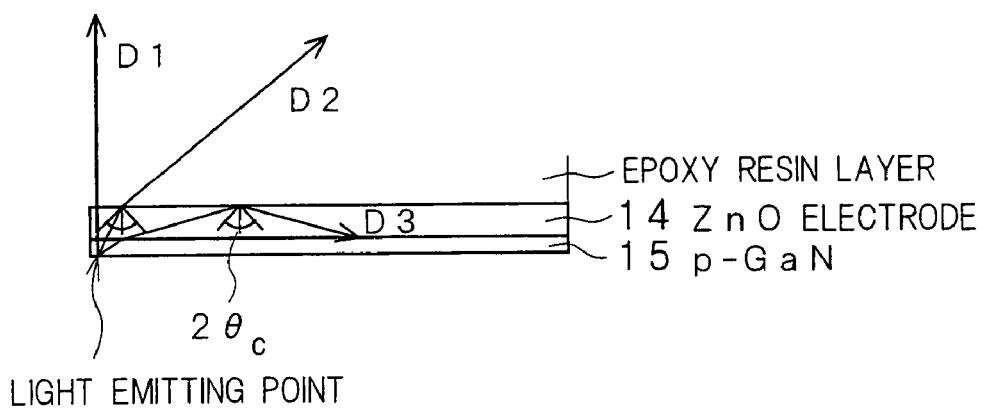
FIGS. 10(a) and (b) are examples of a schematic sectional view to explain light extraction efficiency in the light emitting device.
Figure 10:
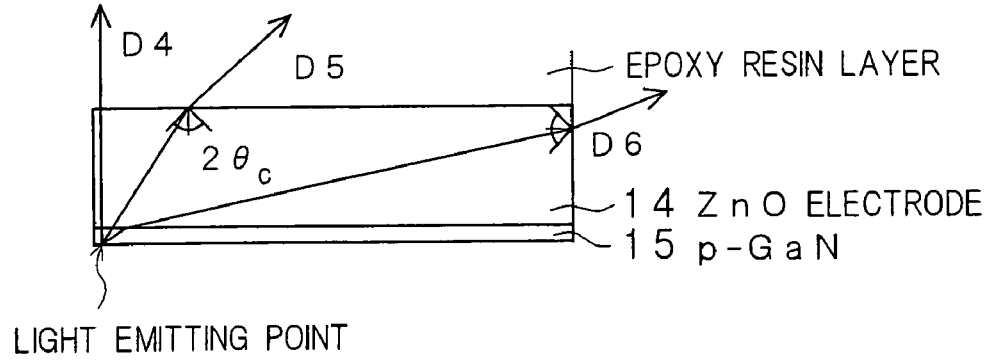
Figure 11:
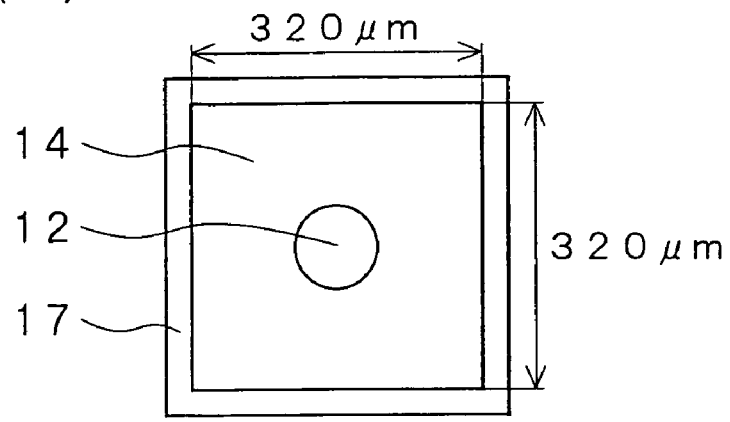
FIGS. 11(a) to (c) are examples of the top face view of the light emitting device.
Figure 11:
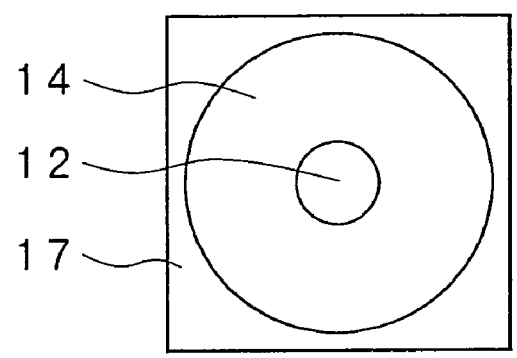
Figure 11:
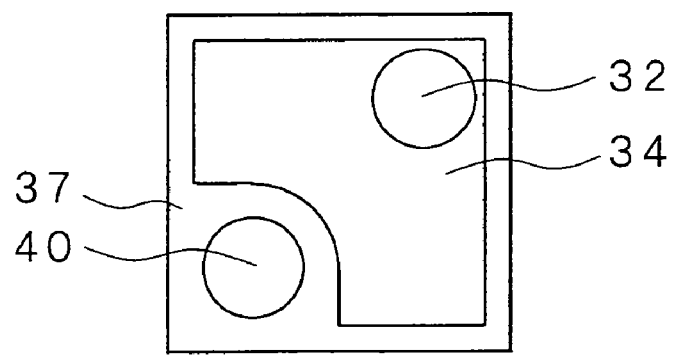

The reason that the light emitting efficiency increases by making the transparent electrode layer thick is explained based on FIGS. 10(a) and (b). In FIGS. 10(a) and (b), for simplicity, only the ZnO transparent electrode layer is formed on the p-type GaN-based semiconductor layer, and furthermore it is covered with an epoxy resin. When the thickness t of the ZnO transparent electrode layer is thin, the light emitted from a light emitting point at the lower left in FIG. 10(a) passes through the p-type GaN-based semiconductor layer and pass through the ZnO transparent electrode layer. When the angle at which the light is incident to the boundary with the epoxy resin that is outside of the ZnO transparent electrode layer from the light emitting layer is a critical angle $\theta_c$ or more, all of the light reflect in the ZnO electrode without passing through the epoxy resin layer (a light beam D3 in FIG. 10(a)). The reflected light returns to the p-type GaN-based semiconductor layer again and is absorbed in the light emitting layer located below it. Therefore, only some light transmitted in the direction of near vertical as to the surface of the ZnO transparent layer (a light beam such as D1 or D2 shown in FIG. 10(a)) can be taken out from the top surface. The critical angle θc is determined by Snell's Law, which is $n_1 \sin \theta_1 = n_2 \sin \theta_2$, and shows a relationship between the incident angle $\theta_1$ and the angle of refraction $\theta_2$ when the light transmits from a medium 1 (refractivity $n_1$) to a medium 2 (refractivity $n_2$). When the angle of refraction $\theta_2$ becomes 90° or more, total reflection occurs and its incident angle $\theta_1$ is the critical angle $\theta_c$. Next, in the case where the ZnO transparent electrode layer is thick, because the light passes through the epoxy resin layer from the side faces of the element before reflecting at the boundary with the epoxy resin layer on the surface, the extraction efficiency of the light is improved (a light beam D6 in FIG. 10(b)). However, in this case, the incident angle of the light at the side face is necessarily within the critical angle $\theta_c$.

Returning to FIG. 1, for the formation of the $Mg_xZn_{1-x}O$ (0≦x≦1) transparent electrode layer 14, a molecular beam epitaxy method (MBE) is preferable in which metal Zn, metal Mg, and metal Ga for doping are heated with a heater and oxygen is supplied with a RF radical cell. However, it can be formed with a vapor deposition method similar to this. In order to form a thick $Mg_xZn_{1-x}O$ (0≦x≦1) transparent electrode layer 14, in terms of deposition speed, a reactive plasma vapor deposition method (RPD) or an ion plating method using a target formed by mixing powders of ZnO, MgO, and $Ga_2O_3$ and then sintering as a raw material, are preferable. Besides, a magnetron sputtering method, an opposed target type sputtering method, a pulse laser deposition method (PLD) (or a laser ablation method), a vapor deposition method, a sol-gel method, a spray pyrolysis method, an electroless plating method, a dip coating method, a coating method, a chemical vapor deposition method (CVD), a metal organic chemical vapor deposition method (MOCVD), etc. are also preferable.

For the transparent electrode layer 14, besides, compounds including oxygen and at least one kind of the elements selected from the group consisting of Mg, Al, Ni, Cu, Zn, Ga, In, Ru, and Sn such as $MgIn_2O_4$, $CuAlO_2$, NiO, $Cu_2O$, $SrCu_2O_2$, LaCuOS, $Ga_2O_3$, $In_2O_3$, ITO, $RuO_2$, and $SnO_2$ are preferable, and $Mg_xZn_{1-x}O$ (0≦x≦1) doped with Ga, B, or Al is preferably available, and the transparent electrode layer 14 may have a layered structure of two layers or more selected from the above-described materials of the transparent electrodes.

After the formation of the $Mg_xZn_{1-x}O$ (0≦x≦s=1) transparent electrode layer 14, a part of the $Mg_xZn_{1-x}O$ (0≦x≦1) transparent electrode layer 14 is removed with wet etching using diluted hydrochloric acid. However, it can be removed with dry etching. Subsequently, a part of the p-type GaN-based semiconductor layer 15, the GaN-based semiconductor light emitting layer 16, and the n-type GaN-based semiconductor layer 17 is removed with dry etching. The metal electrode 12 made of titanium (Ti) and gold (Au) is formed on a part of the surface of the $Mg_xZn_{1-x}O$ (0≦x≦1) transparent electrode layer 14 with a vapor deposition method or a sputtering method. However, a material of the metal electrode can be selected without limiting to these. Using a lift-off method for the formation of the metal electrode 12, the metal electrode 12 can be formed on a part of the surface of the transparent electrode layer 14.

The second metal electrode layer 19 is formed on the underside back surface of the conductive substrate 18 with a vapor deposition method or a sputtering method. In the case where the conductive substrate 18 is a SiC substrate, after forming nickel (Ni), a Ni silicide layer is preferably formed with an annealing process at 1000° C. for 5 seconds. After the formation of the Ni silicide layer, Ti and Au are layered. By making the second metal electrode layer 19 on the back surface of the conductive substrate 18, it functions as a reflection electrode layer having a large reflectivity, an increase of the light emitting output is possible.

The insulating layer 13 is preferably $SiO_u$ (0≦u) or $SiO_uN_v$ (0≦u, 0≦v), and besides, $Mg_xZn_{1-x}O$ (0≦x≦1) and $B_yAl_{1-y-z}Ga_zN$ (0≦y+z≦1, 0≦y, 0≦z) are also preferable. Furthermore, if a material is a compound of at least one kind selected from group II, group III, and group IV elements and at least one kind of oxygen, nitrogen, fluorine, and sulfur, it is superior in the insulating property and transparency, and it is applicable to the insulating layer 13. The insulating layer 13 may have a layered structure of two layers or more of the above-described insulating layer.

The refractivity of the insulating layer 13 is preferably smaller than the refractivity of the transparent electrode layer 14, and in the case of layering the transparent electrode layer 14 or the insulating layer 13, it is preferable that the upper layer has smaller refractivity than that of the under layer. This is because the refractivity gradually becomes close to the refractivity of an air where the light exits finally from the top surface of the layers and the total reflection can be reduced.

The insulating layer 13 is formed so that it covers the metal electrode 12 on the transparent electrode layer 14, the top surface of the transparent electrode and the side faces exposed by etching of the transparent electrode layer 14, the side faces of the p-type GaN-based semiconductor layer 15, a GaN-based semiconductor light emitting layer 16, and the n-type GaN-based semiconductor layer 17 which are exposed by etching. In the case of forming the $SiO_uN_v$ (0≦u, 0≦v) insulating layer, a plasma CVD method is preferable. Besides, a magnetron sputtering method, an opposed target type sputtering method, a pulse laser deposition method (PLD) (or a laser ablation method), a vapor deposition method, an ion plating method, a reactive plasma vapor deposition method (RPD), a molecular beam epitaxy method (MBE), a sol-gel method, a spray pyrolysis method, an electroless plating method, a dip coating method, and a coating method with which the formation of the insulating layer 13 is possible, are also preferable.

When the insulating layer 13 is formed at a thickness of 30 to 40 μm, it is preferable in an increase of the light emitting output. However, it may be as thin as 1 μm or less. When the light emitting area of the element (an area of the light emitting layer) is A and the thickness of the insulating layer is $t_i$, and the value R is represented by Formula (2)

$$R = 3t_i/(A/\pi)^{1/2} - 3(t_i/(A/\pi)^{1/2})^2 + (t_i/(A/\pi)^{1/2})^3 \quad (2)$$

if the insulating layer 13 is formed in a value R so that R is R≧0.1, it is effective for the increasing of the light emitting output. Furthermore, also in this case, as the same as the thickness of the transparent electrode layer, when the thickness of the insulating layer becomes $t_i \geq 1$ μm, the light emitting output increases a few percents or more compared to the case of ti<1 μm. Furthermore, $t_i \geq 5$ μm is preferable and $t_i \geq 10$ μm is more preferable. Further, in the case where the thickness of the insulating layer is formed so as to be $R \geq 0.1$, the increase of the light emitting output of the GaN-based semiconductor light emitting device 11 is possible even though the thickness of the transparent electrode layer 14 is 1 μm or less. Moreover, also in this case, when the abscissa-axis of FIG. 9(a) is made to be the thickness of the insulating layer, it becomes almost the same graph.

After forming the insulating layer 13, a part of the insulating layer 13 is removed by etching in order to expose the surface of the metal electrode 12 on the transparent electrode layer 14. In the case where the insulating layer 13 is $SiO_u N_v$ ($u \geq 0$, $v \geq 0$), a dry etching method is preferable. However, a wet etching method is also applicable.

With the method described above, the first embodiment in the present invention can be formed, and by setting the thickness t of the transparent electrode layer 14 or the thickness $t_i$ of the insulating layer 13 to the thickness such that the value R of the above-described Formula is $R \geq 0.1$, preferably $t \geq 6.5$ μm, and further preferably $t \geq 10$ μm, the semiconductor light emitting device 11 superior in light emitting efficiency and light emitting output is obtained.

Figure 2:
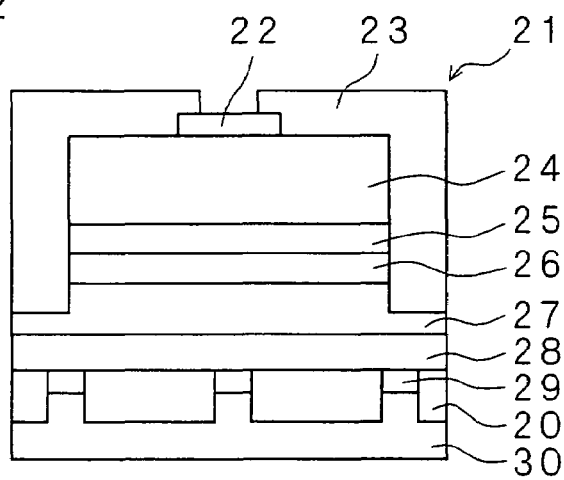
FIG. 2 is a sectional view of the light emitting device of another embodiment in the present invention.

The second embodiment in the present invention is shown in FIG. 2. As shown in FIG. 2, a light emitting device (semiconductor light emitting device) 21 includes a metal electrode 22, an insulating layer 23, a transparent electrode layer 24, a p-type GaN-based semiconductor layer 25, a GaN-based semiconductor light emitting layer 26, an n-type GaN-based semiconductor layer 27, a conductive substrate 28, a pattern electrode layer 29, a second insulating layer 20, and a reflection electrode layer 30.

The difference with the first embodiment is a point that the pattern electrode layer 29, the second insulating layer 20, and the reflection electrode layer 30 are formed in order to improve a reflectivity on the back surface side of the conductive substrate.

The formation of the light emitting device 21 in the second embodiment has the same manufacturing steps as the formation of the metal electrode 12 on the transparent electrode layer 14 in the first embodiment up to the formation of the metal electrode 22 on the transparent electrode layer 24. After the formation of the metal electrode 22 on a part of the top surface of the transparent electrode layer 24, the pattern electrode 29 is formed on a part of the back surface of the conductive substrate 28. In the case where the conductive substrate 28 is SiC, after forming a Ni film with a vapor deposition method or a sputter method, the pattern electrode layer 29 is subjected to an annealing process which is performed at 1000° C. for 5 seconds, and a Ni silicide layer is formed thereon. Continuously, Ti and Au are layered with a vapor deposition method or a sputtering method, and a layered structure of Ni/Ti/Au is formed. Further, after the vapor deposition of Ti and Au, by performing a sinter process at 500° C. for 1 minute, a good electrode structure is obtained. Using a lift-off method, the pattern electrode layer 29 can be formed on a part of the under face of the conductive substrate 28.

The same material as the insulating layer 13 used in the first embodiment is applicable to the second insulating layer 20. In the case where the insulating layer is $SiO_u N_v$ ($u \geq 0$, $v \geq 0$), it is formed to cover the underside face of the pattern electrode 29 and the underside face of the exposed conductive substrate 28 with a plasma CVD method, and a part of the second insulating layer 20 formed on the underside of the pattern electrode layer 29 is removed with etching. Continuously, the reflection electrode layer 30 is formed on the underside of the exposed pattern electrode 29 and the underside of the second insulating layer 20 with a vapor deposition method or a sputtering method. Aluminum (Al) having a high reflectivity is preferable for the reflection electrode layer 30. However, besides, a material is applicable as long as it has a high reflectivity to the wavelength of the light emitted in the semiconductor light emitting layer and has a good conductivity.

After the formation of the reflection electrode layer 30, with the same manufacturing steps as the first embodiment, the insulating layer 23 covering the part of the top surface and the side faces of the transparent electrode 24 can be formed, and the exposure of the metal electrode layer 22 is also the same.

With the method described above, formation of the GaN-based semiconductor light emitting device 21 in the second embodiment is performed, and with the structure of the back surface side of the conductive substrate 28, the light which is emitted in the GaN-based semiconductor light emitting layer 26 and transmitted to the back surface side is reflected effectively, contributes to the increase of the light emitting efficiency. As a result, the light emitting device superior in the light emitting output can be obtained.

Figure 3:
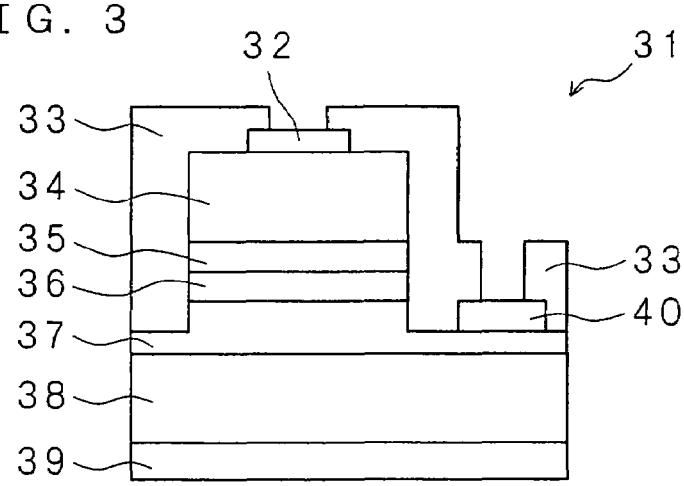
FIG. 3 is a sectional view of the light emitting device of still another embodiment in the present invention.

The third embodiment in the present invention is shown in FIG. 3. As shown in FIG. 3, a light emitting device (semiconductor light emitting device) 31 includes a metal electrode 32, an insulating layer 33, a transparent electrode layer 34, a p-type GaN-based semiconductor layer 35, a GaN-based semiconductor light emitting layer 36, an n-type GaN-based semiconductor layer 37, a non-conductive substrate (insulating substrate) 38, a reflection metal layer 39, and a second metal electrode 40.

The difference with the first embodiment is a point that the substrate 38 is non-conductive and that due to it, the second metal electrode 40 is formed on a part of an exposed surface of the n-type GaN-based semiconductor 37 and the reflection metal layer 39 is formed on the back surface of the non-conductive substrate 38. Sapphire ($Al_2O_3$) is preferable for the non-conductive substrate 38.

In order to form the light emitting device 31 in the third embodiment, the manufacturing steps up to the formation of the metal electrode 32 on the transparent electrode layer 34 are the same as the manufacturing steps up to the formation of the metal electrode 12 on the transparent electrode layer 14 in the first embodiment, a GaN buffer layer may be formed between the n-type GaN-based semiconductor layer 37 and the sapphire substrate 38, the GaN buffer layer may be formed, preferably, at a low temperature of 600° C. or less. The second metal electrode 40 is formed with a vapor deposition method on a part of the exposed surface of the n-type GaN-based semiconductor layer 37 exposed by etching. The second metal electrode 40 has preferably a layered structure of metal layers, and is preferably Ti/Al/Ti/Au structure. Using a lift-off method, the second metal electrode 40 can be formed on a part of the exposed surface of the n-type GaN-based semiconductor layer 37. The formation of the insulating layer 38 is the same as the manufacturing steps in the first embodiment, the reflection metal layer 39 is formed with a vapor deposition method, and aluminum (Al) is preferable.

Figure 4:
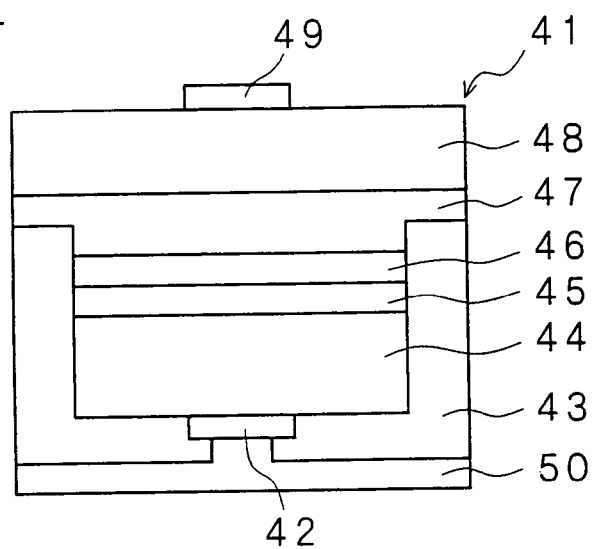
FIG. 4 is a sectional view of the light emitting device of still another embodiment in the present invention.

The fourth embodiment in the present invention is shown in FIG. 4. As shown in FIG. 4, a light emitting device (semiconductor light emitting device) 41 includes a second metal electrode 49, a conductive substrate 48, an n-typed GaN-based semiconductor 47, a GaN-based semiconductor light emitting layer 46, a p-type GaN-based semiconductor layer 45, a transparent electrode layer 44, an insulating layer 43, a metal electrode 42, and a reflection electrode layer 50. In the first embodiment, the main light emitting surface (a surface radiating light) emitted in the light emitting layer is in the side surfaces of the transparent electrode 14. However, in the fourth embodiment, the main light emitting face is in the side surfaces of the conductive substrate 48. When the light emitting device 41 is implemented to a lead frame, etc., by implementing it as to make contact the side of the transparent electrode layer 44 to the lead frame, the light emitting device 41 can radiate the light from the back surface and the side surfaces of the conductive substrate 48 as the main light emitting surface. The light emitting device with such a structure is referred to as a flip-chip type LED.

In order to form the light emitting device 41 in the fourth embodiment, the manufacturing steps up to the manufacturing steps of the metal electrode layer 42 to be formed on a part of the transparent electrode layer 44 are the same as the manufacturing steps up to the formation of the metal electrode 12 on the transparent electrode layer 14 in the first embodiment. Subsequently the insulating layer 43 is formed, and the step is the same as the formation of the insulating layer 13 in the first embodiment. In the formation of the reflection electrode layer 50, aluminum with a high reflectivity is preferable using a vapor deposition method, a sputtering method, or a CVD method. Further, on the connecting face of the metal electrode 42, which is connected electrically to the reflection electrode layer 50, tungsten (W) layer may be formed with a CVD method.

For the conductive substrate 48, SiC is preferable as the same as the first embodiment, and the same steps as the formation of the second metal electrode 19 in the first embodiment are applicable to the formation of the metal electrode 49. An insulating layer may be formed on a part of the surface of the conductive substrate 48 the same as the insulating layer 43 on the transparent electrode layer 44, and if the thickness $t_i$ of the insulating layer is the thickness $t_i$ in which the value R of the above-described equation (2) is R≧0.1, it is preferable because the light emitting efficiency increases.

Figure 5:
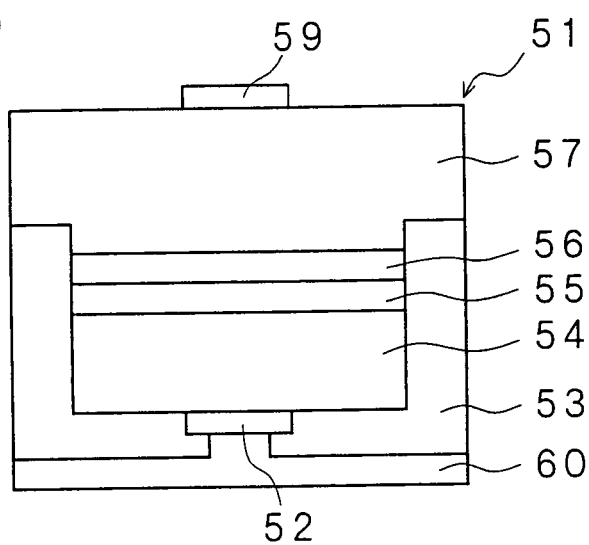
FIG. 5 is a sectional view of the light emitting device of still another embodiment in the present invention.

The fifth embodiment in the present invention is shown in FIG. 5. As shown in FIG. 5, a light emitting device (semiconductor light emitting device) 51 includes a second metal electrode 59, an n-type GaN-based semiconductor 57, a GaN-based semiconductor light emitting layer 56, a p-type GaN-based semiconductor layer 55, a transparent electrode layer 54, an insulating layer 53, a metal electrode 52, and a reflection electrode layer 60. The difference with the fourth embodiment is a point that there is no conductive substrate 48.

In the method of forming in the fifth embodiment, the same manufacturing steps is applicable as in the third embodiment forming the GaN-based semiconductor light emitting device 31 on the non-conductive substrate 38 up to the formation of the metal electrode 32 on the transparent electrode 34 (the metal electrode 53 making contact to the transparent electrode layer 54). Sapphire is preferable as the non-conductive substrate. After forming the metal electrode 52, the insulating layer 53 is formed with the same method as the formation of the insulating layer 13 in the first embodiment, and the reflection electrode layer 60 is formed with the same method as the formation of the reflection electrode layer 50 in the fourth embodiment.

The non-conductive substrate not shown in the Figure can be removed with a laser lift-off (LLO) method. The laser lift-off method is a method in which the substrate is removed from the boundary face with using a KrF excimer laser (wavelength 248 nm), a third harmonic wave (wavelength 355 nm) of YAG laser, or a fourth harmonic wave (wavelength 266 nm) of YAG laser. By applying the laser beam irradiation from the side of the non-conductive substrate, the laser beam passes through the non-conductive substrate, and is absorbed and acts at the boundary face of the non-conductive substrate and the n-type GaN-based semiconductor layer 57, thereby the substrate peels off the n-type layer 57. In order to use this method, a substrate is applicable in spite of whether it is conductive or non-conductive as long as the laser beam passes through, and a laser can be selected as long as it oscillates at a wavelength in which the n-type GaN-based semiconductor layer 57 absorbs.

After removing the substrate, the second metal electrode layer 59 can be formed on the side that has been contacting with the substrate of the n-type GaN-based semiconductor layer 57 with the same steps as the formation of the second metal electrode layer 40 in the third embodiment. The transparent electrode layer may be provided on the surface of the n-type layer 57 as the same as the transparent electrode layer 54 provided with contact to the p-type GaN-based semiconductor layer 55. Furthermore, the insulating layer may be formed on the surface of the transparent electrode layer. In the case where the transparent electrode layer is formed on the surface of the n-type GaN-based semiconductor 57, the second metal electrode 59 may be formed on a part of the surface of the transparent electrode layer formed on the n-type GaN-based semiconductor 57. Further, the thicknesses of the transparent electrode layer or the insulating layer are desirable to be the thickness t or thickness $t_i$ such that the value R of the above-described equations (1) and (2) are R≧0.1.

Figure 6:
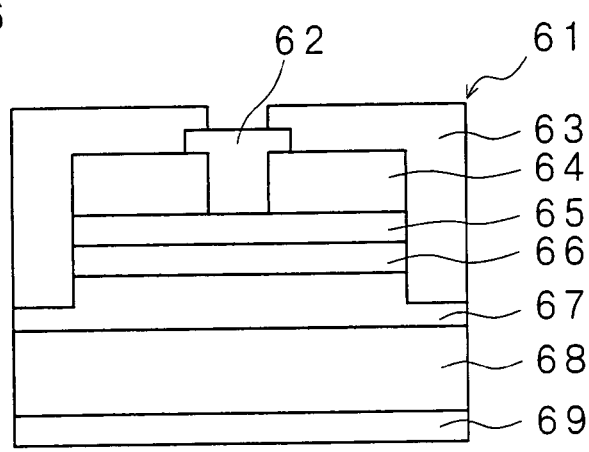
FIG. 6 is a sectional view of the light emitting device of still another embodiment in the present invention.

The sixth embodiment in the present invention is shown in FIG. 6. As shown in FIG. 6, a light emitting device (semiconductor light emitting device) 61 includes a metal electrode 62, an insulating layer 63, a transparent electrode layer 64, a p-type GaN-based semiconductor layer 65, a GaN-based semiconductor light emitting layer 66, an n-type GaN-based semiconductor 67, a conductive substrate 68, and a second metal electrode layer 69. The second metal electrode layer 69 may function as a reflection electrode layer. A point differing from the first embodiment is a point that the metal electrode 62 is formed as contacting with the p-type GaN-based semiconductor layer 65.

In order to form the light emitting device 61 in the sixth embodiment, steps up to the step of removing a part of the transparent electrode layer 64, the p-type GaN-based semiconductor layer 65, the GaN-based semiconductor light emitting layer 66, and the n-type GaN-based semiconductor layer 67 with etching, are as same as the steps forming and etching a part of the transparent electrode layer 14, the p-type GaN-based semiconductor layer 15, the GaN-based semiconductor light emitting layer 16, and the n-type GaN-based semiconductor layer 17 in the first embodiment. Subsequently, a part of the transparent electrode layer 64 is removed with etching, and the metal electrode 62 is formed so as to contact with the top surface of the exposed p-type GaN-based semiconductor layer 65 and a part of the side face (of a contact hall) and the surface of the transparent electrode layer 64. After the metal electrode layer 62 is formed using a vapor deposition method or a sputtering method, an unnecessary part of the metal electrode 62 is removed using a lift-off method. The insulating layer 63 is formed using the same method as the formation of the insulating layer 13 in the first embodiment.

As in this example, by being provided with the metal electrode 62 so as to contact to the p-type GaN-based semiconductor layer 65, and so as to contact also to the side face of the transparent electrode layer 64, electric current flow easily, and by selecting a material for the metal electrode 62 such that it has a Schottky contact with the p-type GaN-based semiconductor layer 62 for the metal electrode 62, the electric current to the underside of the metal electrode 62 can be suppressed. As the light emitted in the light emitting layer under the metal electrode 62 can not pass through the metal electrode 62, the useless emitting light can be suppressed. Therefore, the external quantum efficiency can be improved.

Figure 7:
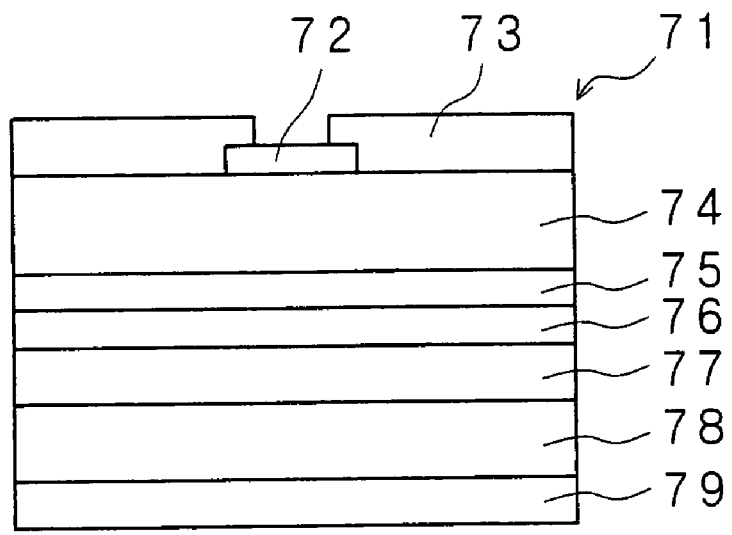
FIG. 7 is a sectional view of the light emitting device of still another embodiment in the present invention.

The seventh embodiment in the present invention is shown in FIG. 7. As shown in FIG. 7, a light emitting device (semiconductor light emitting device) 71 includes a metal electrode 72, an insulating layer 73, a transparent electrode layer 74, a p-type GaN-based semiconductor layer 75, a GaN-based semiconductor light emitting layer 76, an n-type GaN-based semiconductor layer 77, a conductive substrate 78, and a second metal electrode layer 79. The second metal electrode layer 79 may function as a reflection electrode layer. The difference from the first embodiment is a point that the insulating layer 73 does not be provided on the side faces of the transparent electrode layer 74, the p-type GaN-based semiconductor layer 75, the GaN-based semiconductor light emitting layer 76, and the n-typed GaN-based semiconductor layer 77.

The formation in the seventh embodiment is possible with the same manufacturing steps as in the first embodiment up to the step of the formation of the transparent electrode layer 14 (the transparent electrode layer 74). However, because an etching step of the transparent electrode layer 74, the p-type GaN-based semiconductor layer 75, the GaN-based semiconductor light emitting layer 76, and the n-type GaN-based semiconductor light emitting layer 77 is unnecessary, simplification of the manufacturing steps is possible. The formations of the metal electrode layer 72, the insulating layer 73, and the second metal electrode layer 79 are the same as the formations of the metal electrode layer 12, the insulating layer 13, and the second metal electrode layer 19 in the first embodiment.

As in this example, even though an insulating film is not formed on the side faces, by layering the transparent electrode layer 74 and the insulating layer 73 on a surface of the p-type layer 75 such that R in the equation (1) becomes 0.1 or more, where the total thickness of two layers is t, the external quantum efficiency can be improved.

Figure 8:
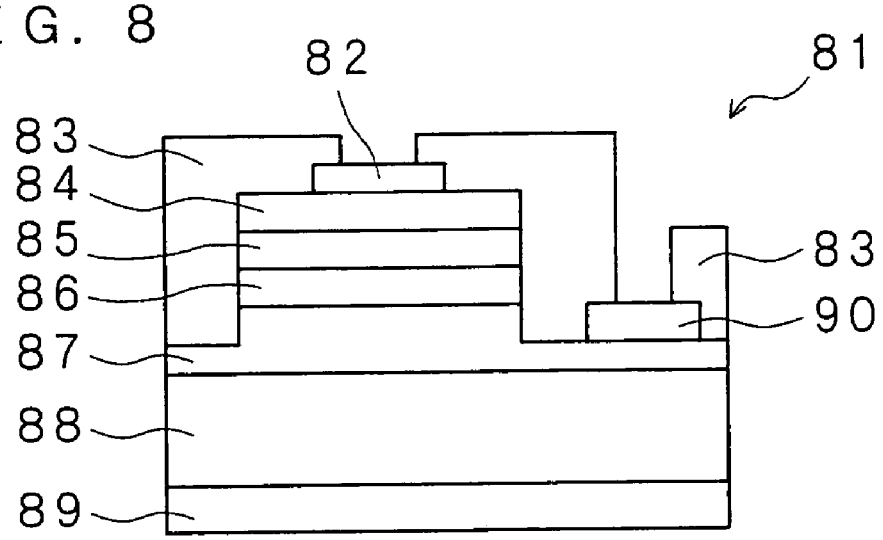
FIG. 8 is a sectional view of the light emitting device of still another embodiment in the present invention.

The eighth embodiment in the present invention is shown in FIG. 8. As shown in FIG. 8, a light emitting device (semiconductor light emitting device) 81 includes a metal electrode 82, an insulating layer 83, a transparent electrode layer 84, a p-type GaN-based semiconductor layer 85, a GaN-based semiconductor light emitting layer 86, an n-type GaN-based semiconductor layer 87, a non-conductive substrate 88, a reflective metal layer 89, and a second metal electrode layer 90. The point differing from the third embodiment is in that the transparent electrode layer is as thin as 1 μm or less.

The formation in the eighth embodiment is the same as the third embodiment. By making only the insulating layer 83 thick, an increase of the light emitting output of the light emitting device 81 is possible. Because of this, the embodiment is applicable also in the case of using the transparent electrode layer 84 in which translucency deteriorates by increasing the thickness of the transparent electrode layer 84 such as a Ni/Au translucent electrode, the light emitting efficiency increases only by making the insulating layer 83 thick while the transparent electrode layer 84 is kept thin. Further, the increasing of the light emitting efficiency is possible contrarily also when the transparent electrode layer 84 is thick and the insulating layer 83 is thin. In short, it is good if the sum t of the thicknesses of the transparent electrode layer and the insulating layer is provided so that R in the above-described equation (1) becomes 0.1 or more.

The above-described embodiments are explained by examples of the case where the transparent electrode layer contacts to the p-type GaN-based semiconductor layer. However, it is not limited to these, and the case where the transparent electrode layer contacts to the n-type GaN-based semiconductor layer is possible. Further, the characteristics of each embodiment are also possibly combined.

As explained above, for practical use of a solid state lighting using LEDs, the improvement of the light emitting efficiency of the LED is necessary, and in the conventional red, orange, and yellow LEDs, the improvement of the light emitting efficiency by making a thick film of the semiconductor current diffusion layer that is transparent to each light emitting wavelength of the LED is performed in the conventional red, orange, and yellow LEDs. On the other hand, in the GaN-based LED emitting green, blue, purple, and ultraviolet lights, because there is not an appropriate material that becomes the transparent semiconductor current diffusion layer, the improvement of the light emitting efficiency is performed by using the transparent electrode layer by ITO and ZnO-based materials instead of the translucent metal electrode by Ni/Au, etc. However, under the present conditions, because the light emitting efficiency of the GaN-based LED is not beyond the light emitting efficiency of a fluorescent lamp, further improvement of the light emitting efficiency is necessary in order to put the illumination by LED to full-practical use properly, and the objective of the present invention is to improve the light emitting efficiency of LED by making the transparent electrode layer or the transparent insulating layer that are conventionally thin having the thickness of a few μm or less thick and using the transparent electrode layer or the transparent insulating layer of the optimum thickness to the light emitting area of the LED chip. In order to achieve the above-described objective, the present invention is a semiconductor light emitting device including a light emitting layer made of a GaN-based semiconductor sandwiched between an n-type GaN-based semiconductor layer and a p-type GaN-based semiconductor layer, the semiconductor light emitting device further including a ZnO-based or an ITO transparent electrode layer, wherein the value of the equation represented by $3t/(A/\pi)^{1/2} - 3(t/(A/\pi)^{1/2})^2 + (t/(A/\pi)^{1/2})^3$ is 0.1 or more, where the thickness of the transparent electrode layer is represented by t and the light emitting area is represented by A.

INDUSTRIAL APPLICABILITY

The present invention can be used as a light source in broad fields such as a back light of a liquid crystal display device, light emitting device used for white, blue-type color or the like, an illumination device, etc.

What is claimed is:
1. A semiconductor light emitting device comprising:
a light emitting layer made of a GaN-based semiconductor sandwiched between an n-type GaN-based semiconductor layer and a p-type GaN-based semiconductor layer; and
a transparent electrode layer which is provided on one side of the light emitting layer and transparent to a wavelength of a light emitted in the light emitting layer,
wherein a value of an equation represented by $3t/(A/\pi)^{1/2} - 3(t/(A/\pi)^{1/2})^2 + (t/(A/\pi)^{1/2})^3$ is 0.1 or more, where a thickness of the transparent electrode layer is represented by t and an area of the light emitting layer is represented by A.

2. A semiconductor light emitting device comprising:
- a light emitting layer made of a GaN-based semiconductor sandwiched between an n-type GaN-based semiconductor layer and a p-type GaN-based semiconductor layer;
- a transparent electrode layer which is provided on one side of the light emitting layer and transparent to a wavelength of a light emitted in the light emitting layer; and
- a transparent insulating layer formed to be in contact with a part of a surface or a part of side faces of the transparent electrode layer,
- wherein a value of an equation represented by $3t_i/(A/\pi)^{1/2} - 3(t_i/(A/\pi)^{1/2})^2 + (t_i/(A/\pi)^{1/2})^3$ is 0.1 or more, where a thickness of the transparent insulating layer is $t_i$ and an area of the light emitting layer is A.

3. The semiconductor light emitting device of claim 1, further comprising:
- an insulating layer formed to be in contact with a part of a surface or a part of side faces of the transparent electrode layer.

4. The semiconductor light emitting device of claim 1, further comprising:
- a transparent insulating layer formed to be in contact with a part of a surface or a part of side faces of the transparent electrode layer,
- wherein a value of an equation represented by $3t_i/(A/\pi)^{1/2} - 3(t_i/(A/\pi)^{1/2})^2 + (t_i/(A/\pi)^{1/2})^3$ is 0.1 or more, where a thickness of the transparent insulating layer is $t_i$ and an area of the light emitting layer is A.

5. The semiconductor light emitting device of claim 1, further comprising:
- a metal electrode to supply an electric current to the n-type GaN-based semiconductor layer or the p-type GaN-based semiconductor layer,
- wherein the transparent electrode layer is formed between the n-type GaN-based semiconductor layer or the p-type GaN-based semiconductor layer and the metal electrode.

6. The semiconductor light emitting device of claim 1, further comprising:
- a metal electrode to supply an electric current to the n-type GaN-based semiconductor layer or the p-type GaN-based semiconductor layer,
- wherein the metal electrode and the transparent electrode layer are adjacent, and
- wherein the metal electrode and the transparent electrode layer are formed to be in contact with the face of the n-type GaN-based semiconductor layer or the face of the p-type GaN-based semiconductor layer.

7. The semiconductor light emitting device of claim 1, wherein the transparent electrode layer comprises a compound including at least one kind selected from the group consisting of magnesium (Mg), aluminum (Al), nickel (Ni), copper (Cu), zinc (Zn), gallium (Ga), indium (In), ruthenium (Ru), and tin (Sn), and including oxygen (O).

8. The semiconductor light emitting device of claim 7, wherein the transparent electrode layer comprises $Mg_xZn_{1-x}O$ ($0 \leq x \leq 1$) doped with gallium (Ga) or boron (B).

9. The semiconductor light emitting device of claim 7, wherein the transparent electrode layer comprises $Mg_xZn_{1-x}O$ ($0 \leq x \leq 1$) doped with aluminum (Al).

10. The semiconductor light emitting device of claim 2, wherein the insulating layer comprises a compound including at least one kind selected from a first element group consisting of a group II element and at least one kind selected from a second element group consisting of oxygen (O), fluorine (F), and sulfur (S).

11. The semiconductor light emitting device of claim 2, wherein the insulating layer comprises a compound including at least one kind selected from a first element group consisting of a group III element and at least one kind selected from a second element group consisting of oxygen (O) and nitrogen (N).

12. The semiconductor light emitting device of claim 2, wherein the insulating layer comprises a compound including at least one kind selected from a first element group consisting of a group IV element and at least one kind selected from a second element group consisting of oxygen (O) and nitrogen (N).

13. The semiconductor light emitting device of claim 2, wherein the insulating layer comprises $Mg_xZn_{1-x}O$ ($0 \leq x \leq 1$).

14. The semiconductor light emitting device of claim 2, wherein the insulating layer comprises $B_yAl_{1-y-z}Ga_zN$ ($0 \leq y+z \leq 1$, $0 \leq y$, $0 \leq z$).

15. The semiconductor light emitting device of claim 2, wherein the insulating layer comprises $SiO_uN_v$ ($0 \leq u$, $0 \leq v$).

16. The semiconductor light emitting device of claim 2, wherein the refractivity $n_i$ of the insulating layer is the refractivity n of the transparent electrode layer or less ($n_i \leq n$).

17. The semiconductor light emitting device of claim 2, wherein the refractivity $n_i$ of the insulating layer is larger than the refractivity n of the transparent electrode layer ($n_i > n$), and the thickness t of the transparent electrode layer is $t \leq 1$ μm.

18. The semiconductor light emitting device of claim 2, further comprising:
- a metal electrode to supply an electric current to the n-type GaN-based semiconductor layer or the p-type GaN-based semiconductor layer,
- wherein the transparent electrode layer is formed between the n-type GaN-based semiconductor layer or the p-type GaN-based semiconductor layer and the metal electrode.

19. The semiconductor light emitting device of claim 2, further comprising:
- a metal electrode to supply an electric current to the n-type GaN-based semiconductor layer or the p-type GaN-based semiconductor layer,
- wherein the metal electrode and the transparent electrode layer are adjacent, and
- wherein the metal electrode and the transparent electrode layer are formed to be in contact with the face of the n-type GaN-based semiconductor layer or the face of the p-type GaN-based semiconductor layer.

20. The semiconductor light emitting device of claim 2, wherein the transparent electrode layer comprises a compound including at least one kind selected from the group consisting of magnesium (Mg), aluminum (Al), nickel (Ni), copper (Cu), zinc (Zn), gallium (Ga), indium (In), ruthenium (Ru), and tin (Sn), and including oxygen (O).

* * * * *